(12) United States Patent
Kuo et al.

(10) Patent No.: US 12,317,512 B2
(45) Date of Patent: May 27, 2025

(54) SOT MRAM STRUCTURE AND FABRICATING METHOD OF THE SAME

(71) Applicant: UNITED MICROELECTRONICS CORP., Hsin-Chu (TW)

(72) Inventors: Chih-Wei Kuo, Tainan (TW); Hung-Chan Lin, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 475 days.

(21) Appl. No.: 17/964,935

(22) Filed: Oct. 13, 2022

(65) Prior Publication Data
US 2024/0107777 A1    Mar. 28, 2024

(30) Foreign Application Priority Data
Sep. 22, 2022  (CN) .......................... 202211157193.2

(51) Int. Cl.
| | | |
|---|---|---|
| H10B 61/00 | (2023.01) | |
| H10N 52/00 | (2023.01) | |
| H10N 52/01 | (2023.01) | |
| H10N 52/80 | (2023.01) | |

(52) U.S. Cl.
CPC ............. *H10B 61/22* (2023.02); *H10N 52/00* (2023.02); *H10N 52/01* (2023.02); *H10N 52/80* (2023.02)

(58) Field of Classification Search
CPC .... H10B 61/20; H10B 61/22; G11C 11/1655; G11C 11/1657; G11C 11/1659; G11C 11/1673; G11C 11/1675; H10N 52/80; H10N 50/01; H10N 50/10; H10N 50/80; H10N 52/00; H10N 52/01
See application file for complete search history.

(56) References Cited

U.S. PATENT DOCUMENTS

| | | | |
|---|---|---|---|
| 9,620,188 B2 | 4/2017 | Manipatruni | |
| 2022/0285609 A1* | 9/2022 | Huang | ................... H10N 50/10 |

* cited by examiner

*Primary Examiner* — Latanya N Crawford Eason
(74) *Attorney, Agent, or Firm* — Winston Hsu (57) ABSTRACT

An SOT MRAM structure includes a word line. A second source/drain doping region and a fourth source/drain doping region are disposed at the same side of the word line. A first conductive line contacts the second source/drain doping region. A second conductive line contacts the fourth source/drain doping region. The second conductive line includes a third metal pad. A memory element contacts an end of the first conductive line. A second SOT element covers and contacts a top surface of the memory element. The third metal pad covers and contacts part of the top surface of the second SOT element.

11 Claims, 6 Drawing Sheets

SOT MRAM STRUCTURE AND FABRICATING METHOD OF THE SAME

BACKGROUND OF THE INVENTION

1. Field of the Invention

The present invention relates to a spin orbit torque (SOT) MRAM structure, and more particularly to an SOT MRAM structure which has a third metal pad connects to and contacts an SOT element.

2. Description of the Prior Art

Many modern day electronic devices contain electronic memory configured to store data. Electronic memory may be volatile memory or non-volatile memory. Volatile memory stores data only while it is powered, while non-volatile memory is able to store data when power is removed. MRAM is one promising candidate for next generation non-volatile memory technology. An MRAM cell includes a magnetic tunnel junction (MTJ) unit having a variable resistance, located between two electrodes disposed within back-end-of-the-line (BEOL) metallization layers.

An MTJ unit generally includes a layered structure comprising a reference layer, a free layer and a dielectric barrier in between. The reference layer of magnetic material has a magnetic vector that always points in the same direction. The magnetic vector of the free layer is free, but is determined by the physical dimensions of the element. The magnetic vector of the free layer points in either of two directions: parallel or anti-parallel with the magnetization direction of the pinned layer.

However, the conventional MRAM still has some problems. For example, the fabricating steps of the interlayer connections for MRAM need to be simplified.

SUMMARY OF THE INVENTION

In view of this, the present invention provides an SOT MRAM structure which has a third metal pad directly contacts an SOT element to decrease the number of plugs, and the fabricating process can be simplified.

According to a preferred embodiment of the present invention, an SOT MRAM structure includes a word line. A first source/drain doping region and a second source/drain doping region are respectively disposed at two sides of the word line, wherein the two sides are opposed to each other. A third source/drain doping region and a fourth source/drain doping region are respectively disposed at the two sides of the word line. A first conductive line contacts the second source/drain doping region. A first bit line electrically connects to the first source/drain doping region. A second conductive line contacts the fourth source/drain doping region, wherein the second conductive line includes a third metal pad. A second bit line electrically connects to the third source/drain doping region. A memory element contacts an end of the first conductive line, wherein the memory element includes a magnetic tunneling junction (MTJ) and a bottom electrode. A second SOT element covers on the memory element and contacts the memory element, wherein the third metal pad covers and contacts part of a top surface of the second SOT element. A source line covers and contacts part of the top surface of the second SOT element.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 to FIG. 9 depict a fabricating method of an SOT MRAM structure according to a preferred embodiment of the present invention, wherein:

DETAILED DESCRIPTION

Figure 1:
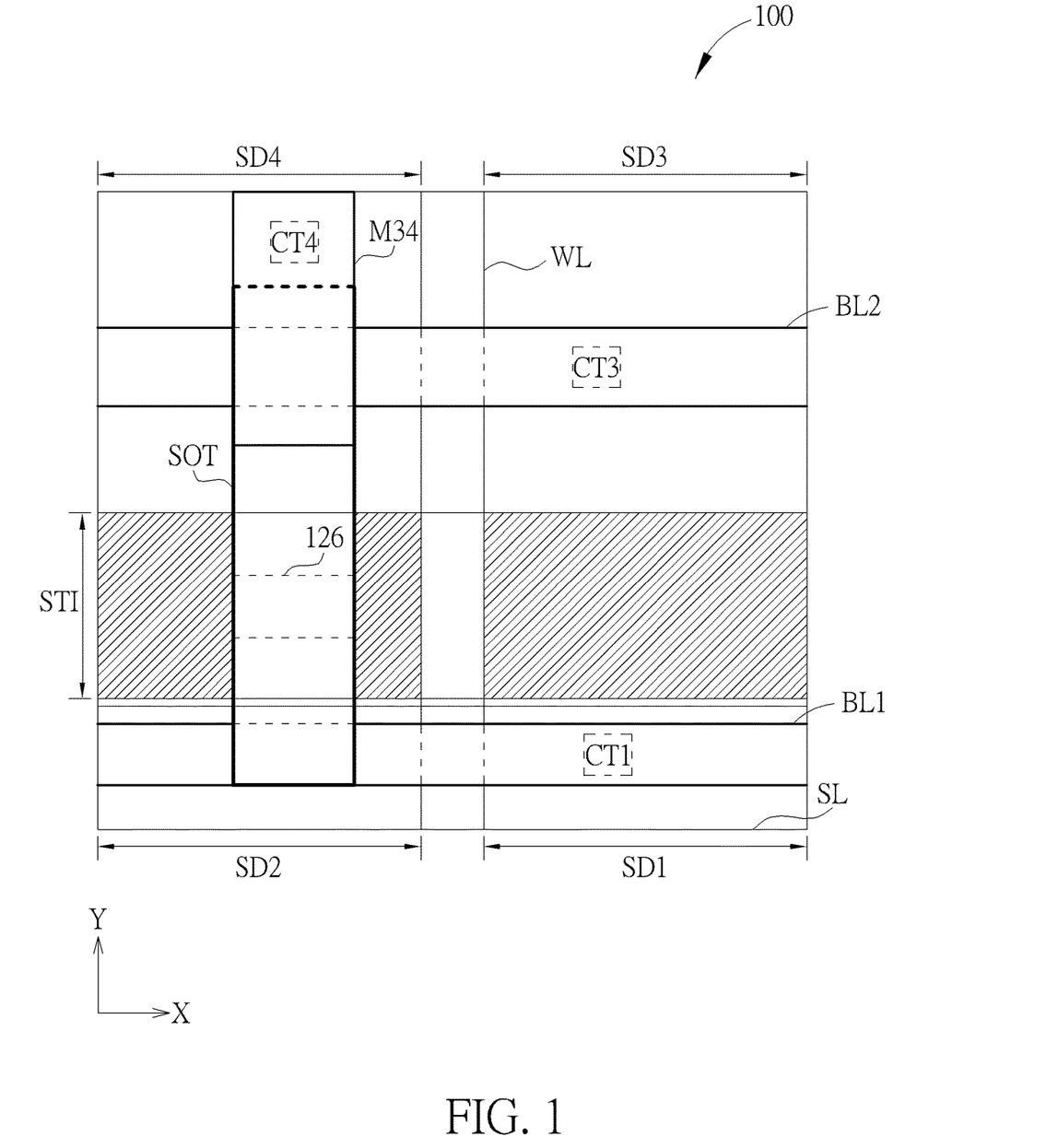
FIG. 1 depicts a top view of a spin orbit torque (SOT) MRAM structure according to a first preferred embodiment of the present invention.
Figure 2:
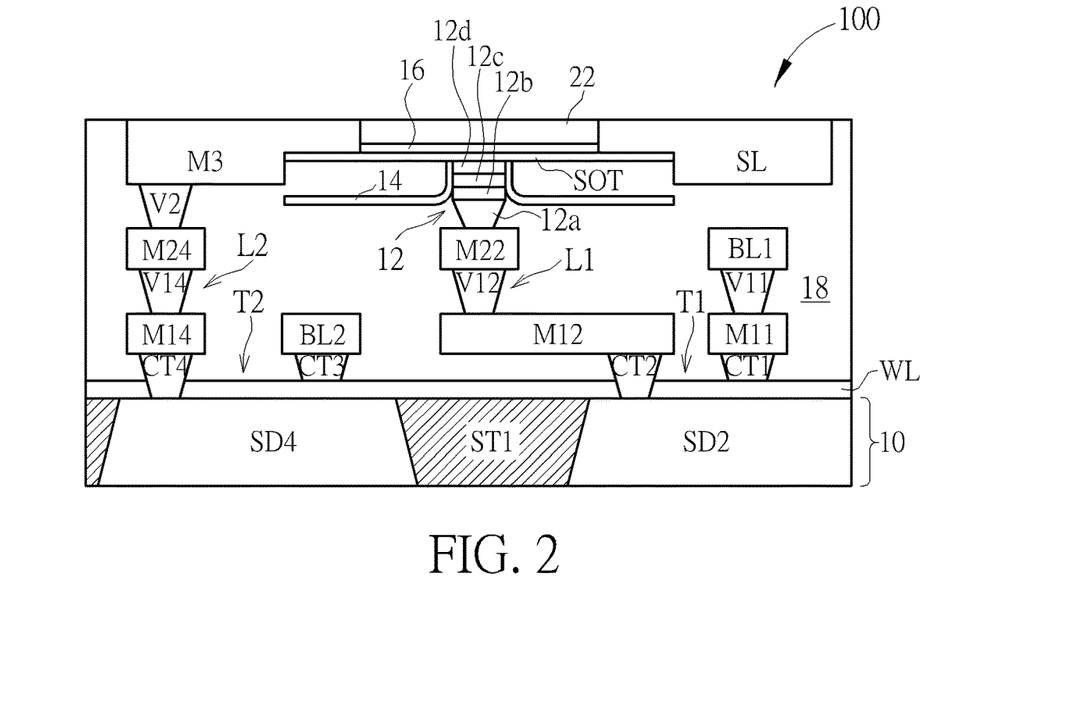
FIG. 2 depicts an SOT MRAM structure schematically according to a first preferred embodiment of the present invention.

FIG. 1 depicts a top view of a spin orbit torque (SOT) MRAM structure according to a first preferred embodiment of the present invention. FIG. 2 depicts an SOT MRAM structure schematically according to a first preferred embodiment of the present invention.

As shown in FIG. 1 and FIG. 2, an SOT MRAM structure 100 includes a substrate 10. A shallow trench isolation STI is embedded within the substrate 10. The substrate 10 which adjacent to the shallow trench isolation STI is defined as an active region. A word line WL covers the substrate 10. The word line WL extends along a first direction Y. A first source/drain doping region SD1 and a second source/drain doping region SD 2 are respectively disposed within two active regions which are at two opposed sides of the word line WL. A third source/drain doping region SD3 and a fourth source/drain doping region SD4 are respectively disposed within other two active regions which are at two opposed sides of the word line WL.

Please refer to FIG. 2. A first conductive line L1 contacts the second source/drain doping region SD2. A second conductive line L2 contacts the fourth source/drain doping region SD4. The first conductive line L1 is formed by a plug CT2, a first metal pad M12, a first plug V12 and a second metal pad M22 stacked from bottom to top. The plug CT2 contacts the second source/drain doping region SD2. A memory element 12 contacts an end of the first conductive line L1. That is, the memory element 12 contacts the second metal pad M22 of the first conductive line L1. In details, the memory element 12 is formed by a bottom electrode 12a, a magnetic tunneling junction (MTJ), a first SOT element 12c, a conductive layer 12d stacked from bottom to top. The bottom electrode 12a contacts the second metal pad M22. The bottom electrode 12a contacts the second metal pad M22. A spacer 14 is disposed on the sidewall of the MTJ 12b, the sidewall of the first SOT element 12c and the sidewall of the conductive layer 12d. Moreover, the width of the MTJ 12b, the width of the first SOT element 12c and the width of the conductive layer 12d are the same. A second SOT element SOT covers on the memory element 12 and contacts the memory element 12. The width of the second SOT element SOT is greater than the width of the MTJ 12b. The end of the second SOT element SOT is aligned with the end of the spacer 14.

The second conductive line L2 contacts the fourth source/drain doping region SD4. The second conductive line L2 is formed by a plug CT4, a first metal pad M14, a first plug V14, a second metal pad M24, a second plug V2 and the third metal pad M3 stacked from bottom to top. It is noteworthy that the third metal pad M3 covers and contacts part of the top surface of the second SOT element SOT. In details, the third metal pad M3 contacts an end of the second SOT element SOT, and the third metal pad M3 extends from the end of the second SOT element SOT to part of the top surface of the second SOT element SOT. In this way, the bottom surface of the third metal pad M3 forms a corner. Furthermore, a source line SL covers and contacts the other part of the top surface of the second SOT element SOT. The top surface of the second SOT element SOT which is not covered by the third metal pad M3 and the source line SL is covered and contacted by a protective layer 16.

As shown in FIG. 1 and FIG. 2, a first bit line BL1 electrically connects to the first source/drain doping region SD1. A contact plug CT1, a first metal pad M11 and a first plug V11 are disposed from bottom to top below the first bit line BL1. The contact plug CT1 contacts the first source/drain doping region SD1. The first plug V11 contacts the first bit line BL1. As shown in FIG. 2, by taking the word line WL as a center line, the first bit line BL1, the contact plug CT1, the first metal pad M11 and the first plug V11 are disposed at one side of the word line WL, and the first conductive line L1 is disposed at another side of the word line WL. The word line WL and the first conductive line L1 are respectively at different cross sections. The first bit line BL1, and the plugs and the metal pads below the first bit line BL1 are at different cross sections from the first conductive line L1. The second bit line BL2, and the plugs and the metal pads below the second bit line BL2 are also at different cross sections from the first conductive line L1. However, in order to see whether plugs, metal pads, and bit lines are made of the same metal layer or not, and to locate the respective positions of the first bit line BL1, the second bit line BL2, the first conductive line L1 and the second conductive line L2; therefore, the word line WL, the first bit line BL1, the second bit line BL2, the plugs and the metal pads are all shown in FIG. 2 even they are at different cross sections.

Similarly, the second bit line BL2 electrically connects to the third source/drain doping region SD3. A plug CT3 is disposed below the second bit line BL2. The plug CT3 contacts the third source/drain doping region SD3. By taking the word line WL as a center line, the second bit line BL2 and the plug CT3 are at the same side of the word line WL, and the second conductive line L2 is at the other side of the word line WL in FIG. 2. That is, the second bit line BL2, the plug CT3, the plug CT1, the first metal pad M11, the first plug V11 and the first bit line BL1 are at the same side of the word line WL. The first conductive line L1, the second conductive line L2, the memory element 12 are at the same side of the word line WL.

The first bit line BL 1 serves as a read bit line, and the second bit line serves as a write bit line. The first source/drain doping region SD1, the second source/drain doping region SD2 and the word line WL which is sandwiched between the first source/drain doping region SD1 and the second source/drain doping region together SD2 form a first transistor T1. The third source/drain doping region SD3, the fourth source/drain doping region SD4 and the word line WL which is sandwiched between the third source/drain doping region SD3 and the fourth source/drain doping region SD4 together form a second transistor T2. Please refer to FIG. 1. The first bit line BL1, the second bit line BL2 and the source line SL are all along a second direction X. The second direction X is perpendicular to the first direction Y.

During writing programming, signal is input from the source line SL, passes the second SOT element SOT, enters the second conductive line L2 by the contact between the third metal pad M3 and the second SOT element SOT, then enters the second transistor T2 and reaches the second bit line BL2. In this way, the torque of the MTJ 12b can be flipped over. During reading programming, signal is input from the source line SL, passes the second SOT element SOT, enters the memory element 12 vertically, passes the first transistor T1 and reaches the first bit line BL1.

Moreover, the plug CT1, the plug CT2, the plug CT3 and the plug CT4 are manufactured at the same stage, and the plug CT1, the plug CT2, the plug CT3 and the plug CT4 respectively has a top surface aligned with one another. The first metal pad M11, the first metal pad M12, the first metal pad M14 and the second bit line BL2 are manufactured at the same stage, and the first metal pad M11, the first metal pad M12, the first metal pad M14 and the second bit line BL2 respectively has a top surface aligned with one another. The first plug V11, the first plug V12, the first plug V14 are manufactured at the same stage, and the first plug V11, the first plug V12, the first plug V14 respectively has a top surface aligned with one another. The second metal pad M22, the second metal pad M24 and the first bit line BL1 are manufactured at the same stage, and the second metal pad M22, the second metal pad M24 and the first bit line BL1 respectively has a top surface aligned with one another. The third metal pad M3 and the source line SL are manufactured at the same stage, and the third metal pad M3 and the source line SL respectively has a top surface aligned with one another.

The first SOT element 12c and the second SOT element SOT may respectively include tungsten, platinum, tantalum or titanium nitride. The protective layer 16 may be silicon nitride or silicon carbide nitride. The spacer 14 may be silicon oxide or silicon nitride. The bottom electrode 12a, all the plugs and metal pads in the present invention are all made of metal.

Figure 3:
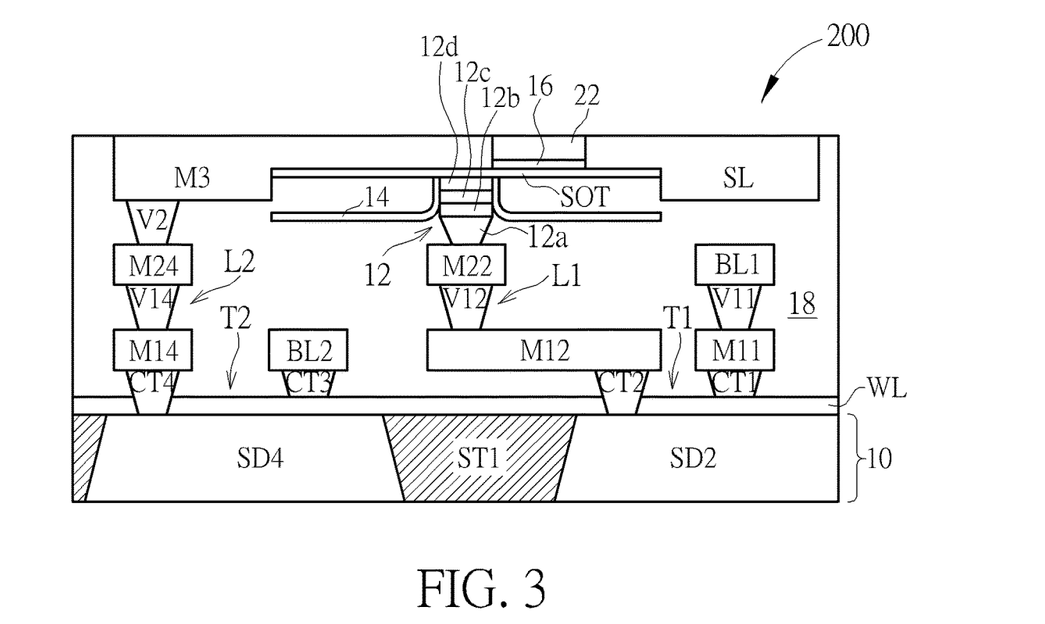
FIG. 3 depicts a top view of an SOT MRAM structure according to a second preferred embodiment of the present invention.
Figure 4:
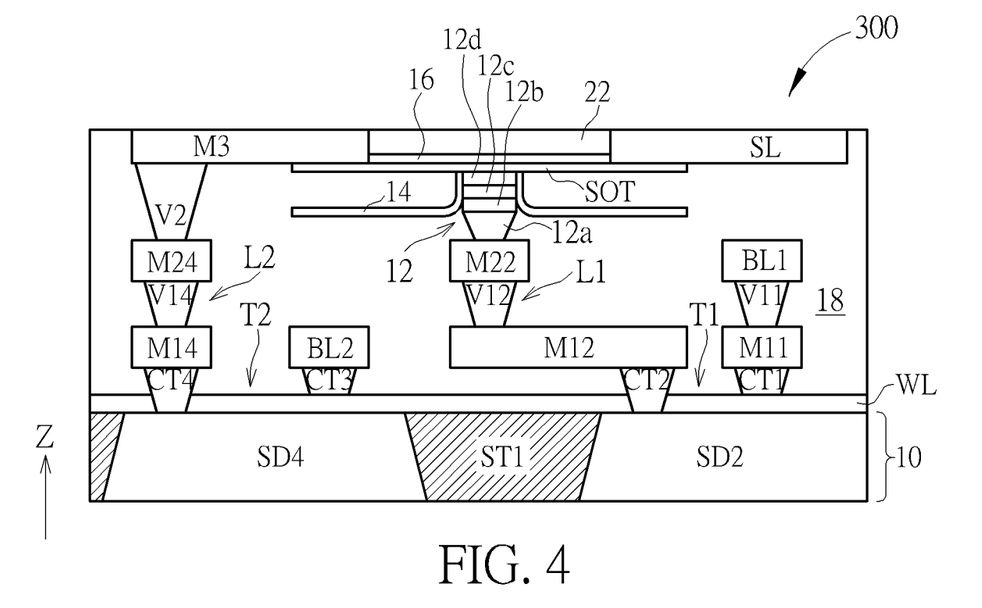
FIG. 4 depicts a top view of an SOT MRAM structure according to a third preferred embodiment of the present invention.

FIG. 3 depicts a top view of an SOT MRAM structure according to a second preferred embodiment of the present invention. FIG. 4 depicts a top view of an SOT MRAM structure according to a third preferred embodiment of the present invention, wherein elements which are substantially the same as those in the embodiment of FIG. 2 are denoted by the same reference numerals; an accompanying explanation is therefore omitted.

The difference between the SOT MRAM structure 200 in FIG. 3 and the SOT MRAM structure 100 in FIG. 2 is that the third metal pad M3 on the top surface of the second SOT element SOT extends to overlap the memory element 12 in FIG. 3. On the contrary, the third metal pad M3 in FIG. 2 does not overlaps the memory element 12. Other devices in FIG. 3 are the same as those in FIG. 2, and the description are therefore omitted. The difference between the SOT MRAM structure 300 in FIG. 4 and the SOT MRAM structure 100 in FIG. 2 is that along the third direction Z in FIG. 4, the entire third metal pad M3 is higher than the second SOT element SOT. In FIG. 2, along the third direction Z, there is part of the third metal pad M3 which is lower than the second SOT element SOT. The third direction Z is perpendicular to the top surface of the substrate 10. Other devices in FIG. 4 are the same as those in FIG. 2, and the description are therefore omitted.

Figure 5:
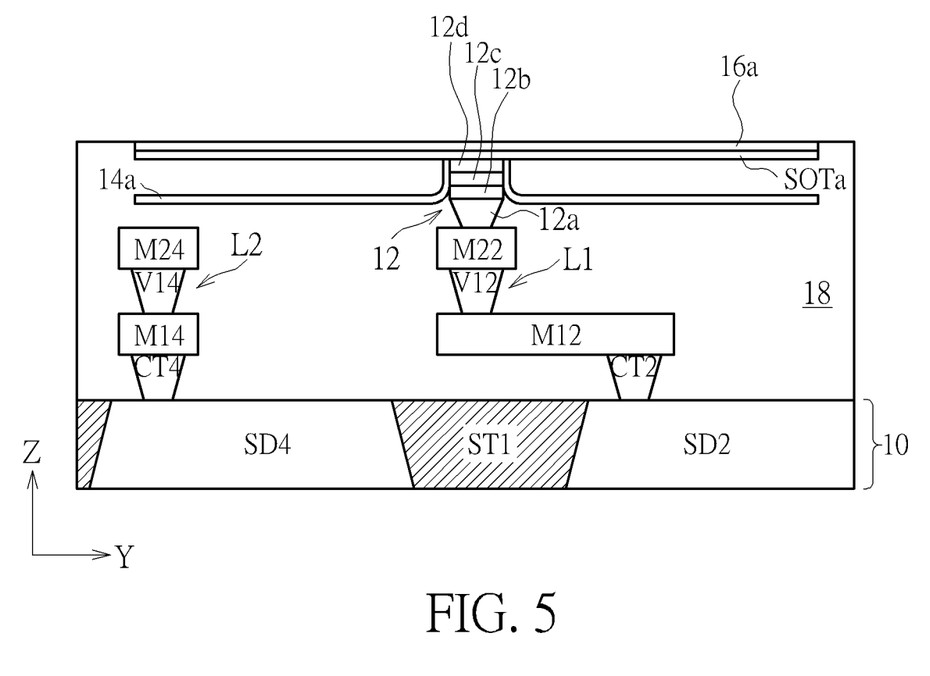

FIG. 5 to FIG. 9 depict a fabricating method of an SOT MRAM structure according to a preferred embodiment of the present invention, wherein elements which are substantially the same as those in the first preferred embodiment are denoted by the same reference numerals; an accompanying explanation is therefore omitted. As shown in FIG. 5, a substrate 10 is provided. A shallow trench isolation STI is embedded within the substrate 10. A second source/drain doping region SD2 and a fourth source/drain doping region SD4 are respectively embedded within the substrate 10 which is at two side of the shallow trench isolation STI. A dielectric layer 18 covers the substrate 10. A plug CT2, a first metal pad M12, a first plug V12 and a second metal pad M22 are stacked from bottom to top. The plug CT2 contacts the second source/drain doping region SD2. A memory element 12 contacts the second metal pad M22. The memory element 12 includes a bottom electrode 12a, an MTJ, a first SOT element 12c, a conductive layer 12d stacked from bottom to top. A spacer material layer 14a is disposed at a sidewall of the memory element 12 and extends along the first direction Y. A plug CT4, a first metal pad M14, a first plug V14, a second metal pad M24 are stacked from bottom to top. The plug CT4 contacts the fourth source/drain doping region SD4. An SOT material layer SOTa covers and contacts the memory element 12. A protective material layer 16a covers and contacts the SOT material layer SOTa.

Figure 6:
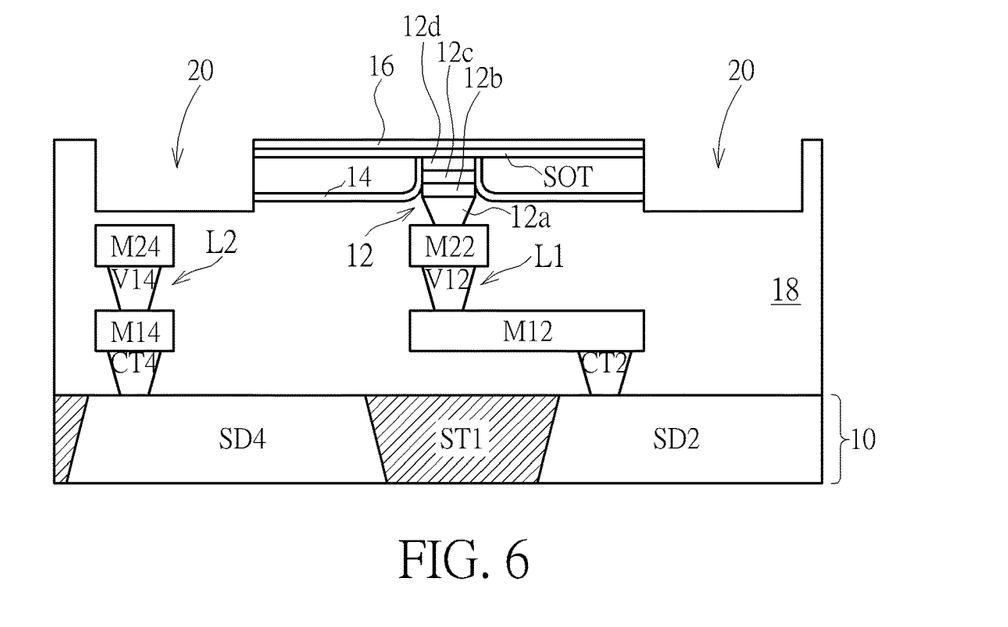
FIG. 6 depicts a fabricating stage following FIG. 5.

As shown in FIG. 6, the protective material layer 16a, the SOT material layer SOTa and the spacer material layer 14a are etched to define the position of a second SOT element SOT. During the etching of the protective material layer 16a, the SOT material layer SOTa and the spacer material layer 14a, part of the dielectric layer 18 is also removed to form two recesses 20. The SOT material layer SOTa which is etched becomes the second SOT element SOT. The spacer material layer 14a which is etched becomes a spacer 14. The protective material layer 16a which is etched becomes a protective layer 16.

Figure 7:
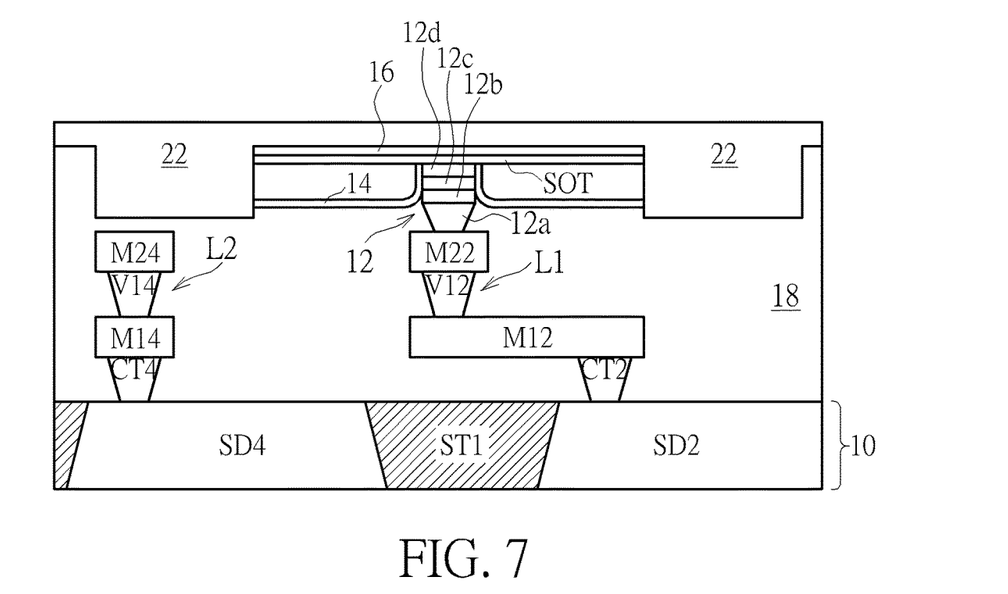
FIG. 7 depicts a fabricating stage following FIG. 6.
Figure 8:
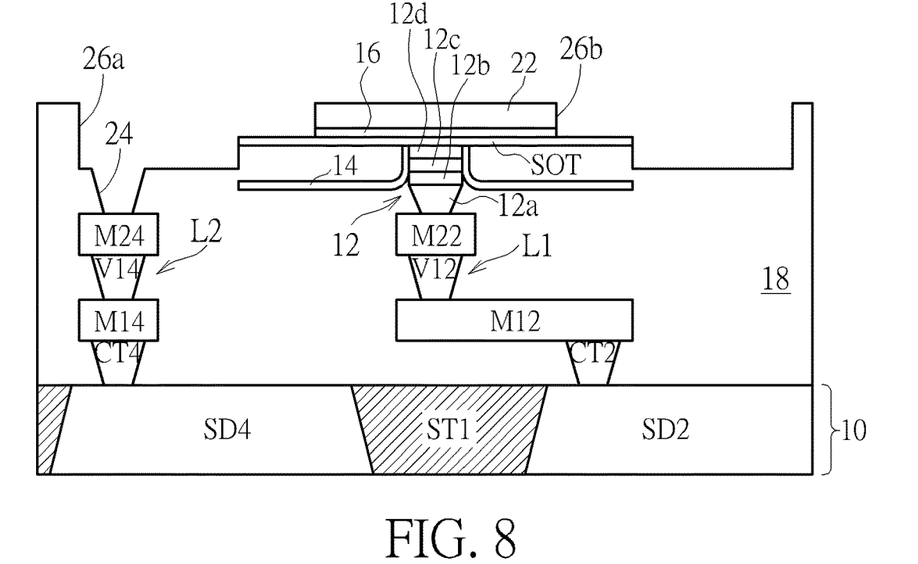
FIG. 8 depicts a fabricating stage following FIG. 7.
Figure 9:
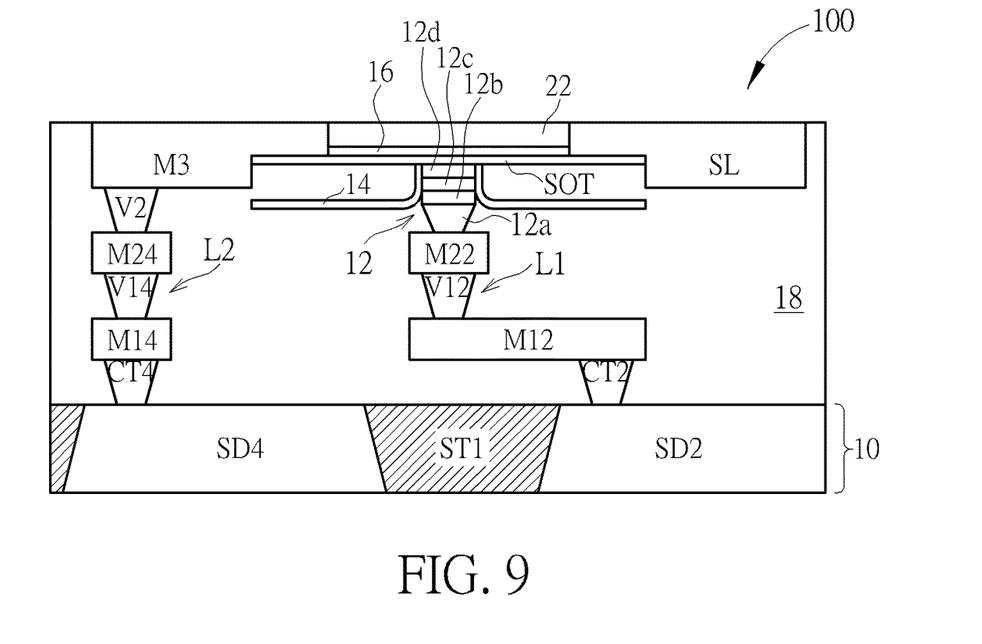
FIG. 9 depicts a fabricating stage following FIG. 8.

As shown in FIG. 7, a dielectric layer 22 is formed to fill in the recesses 20. As shown in FIG. 8, the dielectric layers 18/22 and the protective layer 16 are etched to form a contact hole 24, a recess 26a and a recess 26b. The second metal pad M24 is exposed through the contact hole 24. Part of the second SOT element SOT is exposed through the recess 26a and the recess 26b. The fabricating stage of the contact hole 24, the recess 26a and the recess 26b can be a dual damascene process. As shown in FIG. 9, a metal layer fills in the contact hole 24, the recess 26a and the recess 26b to form a second plug V2, a third metal pad M3 and the source line SL.

Figure 10:
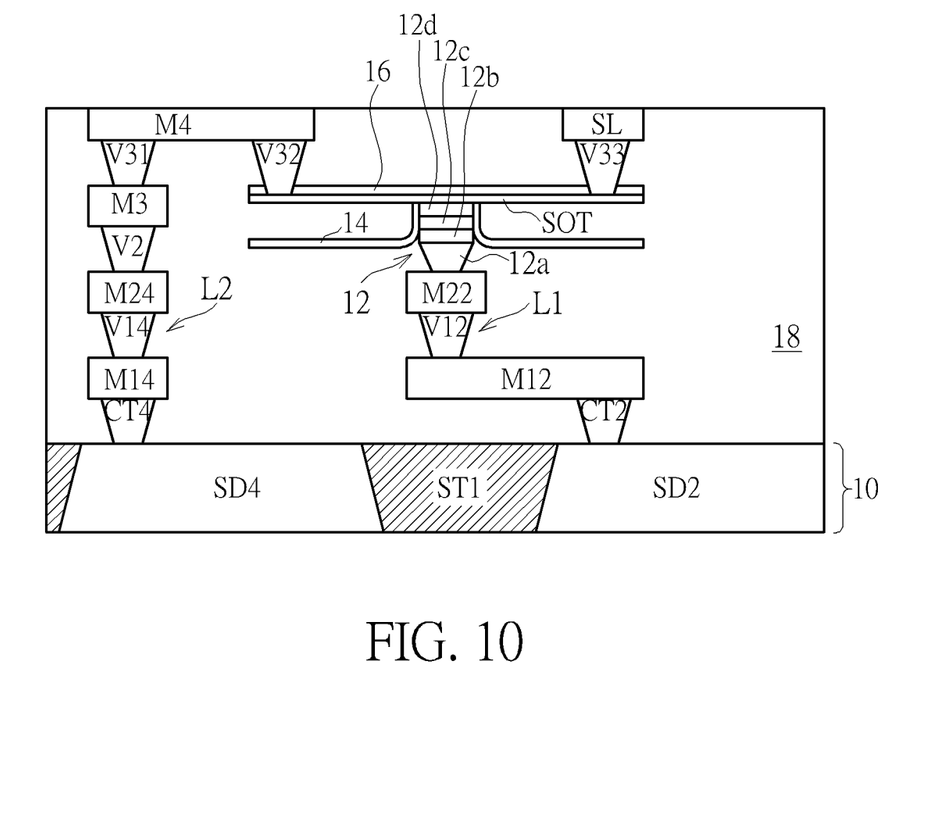
FIG. 10 depicts an SOT MRAM structure according to an example of the present invention.

FIG. 10 depicts an SOT MRAM structure according to an example of the present invention, wherein elements which are substantially the same as those in the first preferred embodiment of are denoted by the same reference numerals; an accompanying explanation is therefore omitted.

As shown in FIG. 9 and FIG. 10, the SOT MRAM structure 100 utilizes the third metal pad M3 and the source line SL to directly contact the second SOT element SOT. However, as for the SOT MRAM structure in FIG. 10, numerous third plugs V31/V32/V33 are disposed on the second SOT element SOT and the third metal pad M3. Then, a fourth metal pad M4 is needed to be formed to connect the third plugs V31/V32. Therefore, the SOT MRAM structure 100 in FIG. 9 simplifies the fabricating process of metal interlayer connections.

Moreover, as shown in FIG. 9, the second SOT element SOT is disposed on the memory element 12. As shown in FIG. 5 and FIG. 6, the memory element 12 is formed before the second SOT element SOT. The fabricating process of the memory element 12 includes an etching process. If the second SOT element SOT is disposed below the memory element 12, the top surface of the second SOT element SOT will be damaged during the etching process for the memory element 12. However, the second SOT element SOT of the present invention is disposed on the memory element 12. In this way, the top surface of the second SOT element SOT can be prevented from damaged.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A spin orbit torque (SOT) MRAM structure, comprising:
   a word line;
   a first source/drain doping region and a second source/drain doping region respectively disposed at two sides of the word line, wherein the two sides are opposed to each other;
   a third source/drain doping region and a fourth source/drain doping region respectively disposed at the two sides of the word line;
   a first conductive line contacting the second source/drain doping region;
   a first bit line electrically connecting to the first source/drain doping region;
   a second conductive line contacting the fourth source/drain doping region, wherein the second conductive line comprises a third metal pad;
   a second bit line electrically connecting to the third source/drain doping region;
   a memory element contacting an end of the first conductive line, wherein the memory element comprises a magnetic tunneling junction (MTJ) and a bottom electrode;
   a second SOT element covering on the memory element and contacting the memory element, wherein the third metal pad covers and contacts part of a top surface of the second SOT element; and
   a source line covering and contacting part of the top surface of the second SOT element.

2. The SOT MRAM structure of claim 1, wherein the first conductive line is formed by a plug, a first metal pad, a first plug and a second metal pad stacked from bottom to top.

3. The SOT MRAM structure of claim 2, wherein the bottom electrode of the memory element contacts the second metal pad.

4. The SOT MRAM structure of claim 1, wherein the second conductive line is formed by a plug, a first metal pad, a first plug, a second metal pad, a second plug and the third metal pad stacked from bottom to top.

5. The SOT MRAM structure of claim 1, wherein the first bit line is a read bit line and the second bit line is a write bit line.

6. The SOT MRAM structure of claim 5, wherein a plug, a first metal pad and a first plug are disposed below the first bit line from bottom to top, the plug contacts the first source/drain doping region, and the first plug contacts the first bit line.

7. The SOT MRAM structure of claim 5, wherein a plug is disposed below the second bit line, an end of the plug contacts the third source/drain doping region and another end of the plug contacts the second bit line.

8. The SOT MRAM structure of claim 1, wherein the memory element further comprising a first SOT element and a conductive layer, the memory element is formed by the bottom electrode, the MTJ, the first SOT element, the conductive layer stacked from bottom to top.

9. The SOT MRAM structure of claim 1, wherein the third metal pad contacts an end of the second SOT element, and the third metal pad extends from the end to part of the top surface of the second SOT element.

10. The SOT MRAM structure of claim 1, wherein the first source/drain doping region, the second source/drain doping region and the word line which is sandwiched between the first source/drain doping region and the second source/drain doping region together form a first transistor.

11. The SOT MRAM structure of claim 1, wherein the third source/drain doping region, the fourth source/drain doping region and the word line which is sandwiched between the third source/drain doping region and the fourth source/drain doping region together form a second transistor.

* * * * *